(12) United States Patent
Hamada

(10) Patent No.: US 8,960,928 B2
(45) Date of Patent: Feb. 24, 2015

(54) PELLICLE FRAME

(75) Inventor: Yuichi Hamada, Annaka (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 35 days.

(21) Appl. No.: 13/367,817

(22) Filed: Feb. 7, 2012

(65) Prior Publication Data

US 2012/0200921 A1    Aug. 9, 2012

(30) Foreign Application Priority Data

Feb. 8, 2011 (JP) ................................ 2011-024733
Jan. 12, 2012 (JP) ................................ 2012-003755

(51) Int. Cl.
| | |
|---|---|
| G02B 23/16 | (2006.01) |
| G03B 11/04 | (2006.01) |
| G02B 5/22 | (2006.01) |
| G02B 7/00 | (2006.01) |
| G03F 7/20 | (2006.01) |
| G03F 1/64 | (2012.01) |

(52) U.S. Cl.
CPC .............. *G03F 7/70983* (2013.01); *G03F 1/64* (2013.01)
USPC .......................................... 359/511; 359/892

(58) Field of Classification Search
USPC .............. 359/350, 511, 355, 629, 892; 430/5; 428/14; 355/30
See application file for complete search history.

(56) References Cited

U.S. PATENT DOCUMENTS

| | | | |
|---|---|---|---|
| 4,861,402 A | | 8/1989 | Gordon |
| 2003/0035222 A1* | | 2/2003 | Okada et al. .................. 359/629 |
| 2004/0123950 A1* | | 7/2004 | Boyd .......................... 156/345.3 |
| 2006/0127691 A1* | | 6/2006 | Chiu et al. ..................... 428/626 |
| 2008/0094591 A1* | | 4/2008 | Eschbach et al. ............... 355/30 |

FOREIGN PATENT DOCUMENTS

JP    S58-219023    12/1983

* cited by examiner

*Primary Examiner* — Ricky Mack
*Assistant Examiner* — Mustak Choudhury
(74) *Attorney, Agent, or Firm* — Manabu Kanesaka

(57) ABSTRACT

There is provided a pellicle which comprises a pellicle frame having eight or more jig holes in the outer wall for receiving jig pins of pellicle handling jigs; the jig holes are arranged such that the pellicle frame can be held by two or more pellicle handling jigs at the same time, and preferably the jigs holes are on the outer walls of the all frame bars so that the pellicle frame can be held by the jigs at both the longer frame bars and the shorter frame bars at the same time.

6 Claims, 2 Drawing Sheets

F I G. 1
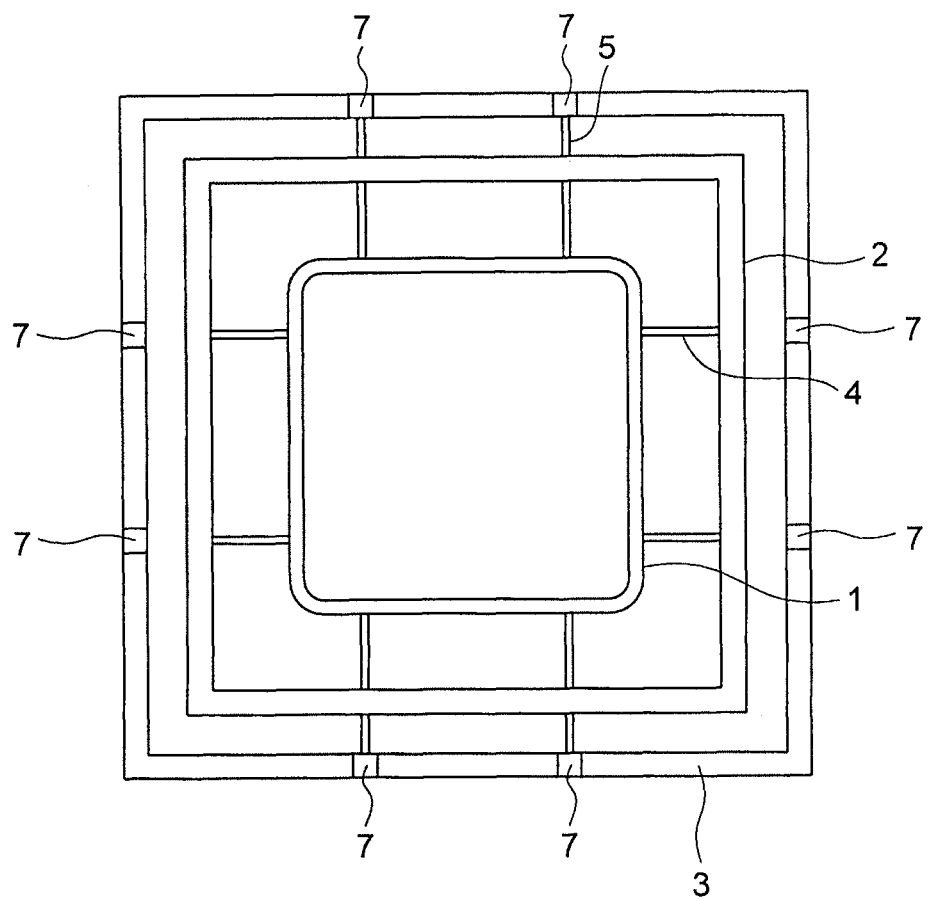

F I G. 2
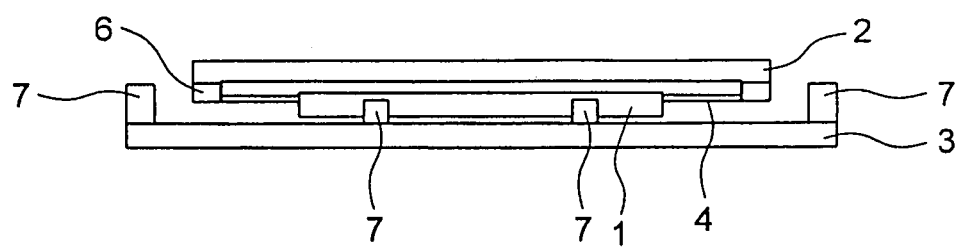

PELLICLE FRAME

PRIORITY CLAIMED

The present non-provisional application claims priority, as per Paris Convention, from Japanese Patent Application Applications No. 2011-024733 filed on Feb. 8, 2011 and No. 2012-003755 filed on Jan. 12, 2012, the disclosure of which is hereby incorporated by reference herein in its entirety.

FIELD OF THE TECHNOLOGY

The present invention relates to a pellicle frame belonging to a pellicle for lithography—which is used to fend off dust from a mask for lithography during a process of manufacturing a semiconductor device such as LSI and VLSI or a liquid crystal display panel.

BACKGROUND OF THE INVENTION

In the manufacture of a semiconductor device such as a large scale integrated circuit (LSI) and a very large scale integrated circuit (VLSI), or a liquid crystal display panel, a semiconductor wafer or a mother substrate for a liquid crystal display panel is irradiated with exposure light via an exposure stencil such as a photomask or a reticle, whereby a pattern of the stencil is transferred onto the surface of the wafer or the mother substrate; however, if a dust particle exists on the stencil, this particle can absorb or bend the exposure light to thereby deform the pattern or blur the edges of the pattern transferred; furthermore the underlying surface is also blackened by soiling, whereby the size, quality, appearance and the like of the semiconductor wafer or the liquid crystal display panel mother substrate are degraded. In the present invention, an "exposure stencil" shall mean a mask for lithography or a reticle.

In order to prevent these problems, the operation of exposing the substrates is generally conducted in a clean room. However, even in a clean room environment, it is not always easy to keep the exposure stencil dust-free, and hence in order to fend off the dust from the surface of the exposure stencil, a pellicle which passes exposure light well is attached to cover the exposure stencil. In this manner, the dust is prevented from reaching the surface of the exposure stencil but can only alight on the pellicle membrane so that, if the exposure light is set to focus on the pattern of the exposure stencil, the dust on the pellicle membrane fails to shadow itself in the transferred pattern.

In general, a pellicle is manufactured by adhering a pellicle membrane to one annular face of a pellicle frame. The pellicle membrane is made of a nitrocellulose, cellulose acetate, a fluorine-containing polymer, or the like that has a high transmittance with respect to an exposure light (such as g-line, i-line, KrF excimer laser, ArF excimer laser, and $F_2$ excimer laser). The pellicle frame is made of an aluminum alloy such as A7075, A6061, and A5052, which are black almite-anodized in the surface, or of a stainless steel or of polyethylene, etc.

In manufacturing a pellicle, the adhesion of the pellicle membrane to an annular face of the pellicle frame is effected by laying a solvent capable of dissolving the pellicle membrane on the annular face and placing the membrane over the solvent and drying the latter by air flow (ref. IP Publication 1), or by using an adhesive such as acrylic resin, epoxy resin and fluorine-containing resin (ref. IP Publication 2). Furthermore, on the other one of the two annular faces of the frame is laid a stencil-bonding agglutinant layer made of a polybutene resin, a polyvinyl acetate resin, an acrylic resin, a silicone resin or the like for attaching the pellicle frame to the exposure stencil, such as a reticle or a mask, and over this stencil-bonding agglutinant layer is laid a releasable liner for protecting the stencil-bonding agglutinant layer.

A pellicle is set in a manner such that the pellicle frame entirely surrounds the pattern region formed in the surface of the exposure stencil. As the pellicle is installed for the purpose of preventing the dust from adhering to the exposure stencil, the pattern region is thereby isolated from the external atmosphere so that the dust outside the pellicle cannot reach the pattern region.

In recent years, the design rules for LSI have been modified in the direction of heightening the resolution density as high as sub-quarter micron order, and this goes hand-in-hand with shortening of the exposure light wavelength. In other words, the formerly prevalent g-line (436 nm) and i-line (365 nm) created by mercury lamps are being replaced by KrF excimer laser (248 nm), ArF excimer laser (193 nm), $F_2$ laser (157 nm) and the like. With the increasing exposure resolution accompanied by the shortening of the wavelengths of the exposure lights, a concern being harbored anew is the contamination with infinitesimal particles of such smaller sizes that conventionally caused scarce problem.

In order to hold a pellicle frame firmly while a pellicle is manufactured, transported or attached to or detached from an exposure stencil, a pellicle handling jig is used for the holding, and normally pins are provided to the jig to catch the pellicle frame. Hence the pellicle frame is usually formed with holes for receiving the jig pins. By inserting the jig pins into the jig receiving holes (hereinafter merely "jig holes") in a manner such that the pins press themselves against the frame, the pellicle frame is grasped. The pressure of these pins is caused by the spring mechanism installed in each pin and thus the pins are capable of freely contracting in the lengthwise direction and regaining its original length.

Conventionally, when it was necessary to replace a pellicle handling jig to a different one between pellicle manufacturing steps, the pellicle frame held by the jig had to be released from the jig and temporarily placed on a table and then, after the replacement of the handling jigs in the manufacturing line, it was set to the different handling jig.

However, in this procedure, the pellicle frame, which was free of any contact with any other matter except at its jig holes, was obliged to get in contact with a foreign matter if not for a long time, and as the result the pellicle frame would get contaminated with a foreign particle or the like where it touched the foreign matter.

PRIOR ART DOCUMENTS

[IP Publication 1] Japanese Patent Application Publication S58-219023
[IP Publication 2] U.S. Pat. No. 4,861,402

DISCLOSURE OF THE INVENTION

Problems the Invention Seeks to Solve

The present invention was contrived to solve the above-stated problem, and therefore it proposes to provide a pellicle frame which is capable of reducing the contamination to the pellicle through a prevention of particle generation at the time when the pellicle handling jigs are exchanged during the manufacturing process or transportation, or use of the pellicle.

Means to Solve the Problems

Then inventor of the present invention vigorously studied to solve the problem and as the result realized that it was important to prevent the pellicle frame from contacting other matters except at its jig holes, and that, since a conventional pellicle frame has only two holes in each side bar of a single pair of opposite side bars, if one handling jig has grasped the frame, there exist no other jig holes that are not used, and at this he hit upon the invention.

In particular, the present invention proposes a pellicle frame wherein at least two more jig holes are made in each one of either pair of opposite side bars for handling the pellicle.

Hence, according to the present invention, there are eight or more jig holes for handling the pellicle, either two or more being in each one of the four side bars or at least four being in each one of a certain pair of opposite side bars. Preferably there are two or more jig holes made in each one of the four side bars.

Effects of the Invention when the pellicle frame of the present invention is used, it is possible to grasp the frame with more than one handling jigs at the same time so that the pellicle frame does not contact with other matters except at its jig holes during the pellicle manufacturing, etc., and thus it is possible to minimize the contamination of the frame.

BRIEF DESCRIPTION OF THE DRAWINGS

FIG. 1 This is a plan view showing how a pellicle frame of the present invention is grasped by two handling jigs.

FIG. 2 This is a side view of the pellicle frame and the handling jigs as of FIG. 1.

EXAMPLES EMBODYING THE INVENTION

Now we will explain the present invention in detail using the drawings as reference.

FIG. 1 is a plan view showing how a pellicle frame of the present invention is grasped by two handling jigs, and FIG. 2 shows this from a side. The rectangular pellicle frame of FIGS. 1 and 2 has eight jig holes, of which two each are made in each of its four side bars. More specifically, the longer side bars each have two jig holes, which are at a same distance from the middle of the respective longer side bar, and so do the shorter side bars. The pellicle frame of the present invention has eight or more jig holes for handling the pellicle, either at least four being in each one of a certain pair of opposite side bars or two or more being in each one of the four side bars, so that it becomes possible for the frame to be grasped by two or more handling jigs. In the case shown in FIGS. 1 and 2, jig pins 4 of a handling jig 2 (for earlier step(s)) are inserted in the jig holes of the longer side bars, and jig pins 5 of a handling jig 3 (for later step(s)) are inserted in the jig holes of the shorter side bars whereby the pellicle frame 1 is grasped by the two handling jigs 2, 3. Incidentally, the jig holes and the jig pins are precisely positioned to meet each other.

In a conventional pellicle frame, there were only two holes in each one of a pair of opposite side bars, but in the present invention, in addition to these, there are at lest two jig holes in each one of the same pair or the other pair of opposite side bars (hence 8 or more in all in one frame). As said above, these additional jig holes may be made in the same pair of the opposing bars that have the original four jig holes or in the other pair so long as the holes have sufficient distance from each other, but from the view point of space economy and operability, it is preferable that the additional jig holes are made in the pair of the side bars different from the bars having the original jig holes. The number of the additional jig holes made in each one of a certain pair of the side bars may be more than two so long as there are as many as the jig pins.

As explained above, the pellicle frame of the present invention has eight or more jig holes, either two or more being in each one of the four side bars or at least four being in each one of a certain pair of opposite side bars, so that the more than one handling jigs can be used to grasp the pellicle frame at the same time, and as the result, it is now possible to exchange handling jigs between the manufacturing steps without allowing a foreign matter to come in contact with the pellicle frame except at the jig holes. Consequently, it is now possible to virtually annihilate the possibility of pellicle frame contamination during the application, transportation, etc. of the pellicle.

The construction of a jig hole made in the pellicle frame of the present invention is preferably the conventionally adopted ones, such as circular in cross section as cut across a plane vertical to the central axis, and tapered to converge at its bottom. By adopting the conventional construction, it is possible to develop the manufacturing apparatus and handling jig enjoying the state of the art technology that has been established from the past.

EXAMPLES

Now, we will explain the present invention using examples.

Example 1

As a pellicle frame, one made of an aluminum alloy, JIS A7075, was prepared, which was black almite-anodized in the surface and measured externally 150 mm by 122 mm and 5.8 mm in height and 2 mm in the width of the pellicle bar. Each of the longer frame bars was bored to have two jig holes in its outer side face at positions 52 mm away from the middle of the respective longer frame bar (124 mm apart from each other), and all were distanced from the pellicle membrane receiving annular face of the frame 1 by 1.75 mm and had a diameter of 1.6 mm and a depth of 1.2 mm; each of the shorter frame bars was bored in the same manner as in the case of the longer bars except that each hole is distanced from the respective middle of the shorter bars by 47 mm (94 mm apart from each other).

By using an earlier-step pellicle handling jig 2, the pellicle frame 1 was engaged with the jig 2 at the 104 mm-distanced jig holes of the longer side bars of the frame 1. After application of an adhesive to the inner walls of the pellicle frame 1, the pellicle frame 1 was further engaged with a later-step pellicle handling jig 3 at the 94 mm-distanced jig holes of the shorter side bars of the frame 1 by means of a jig replacement apparatus (not shown) so as to allow a removal of the earlier-step handling jig 2 without dropping the frame 1.

Incidentally as shown in FIGS. 1 and 2, the jig pins 4 and 5 extend from respective blocks 6, 7 attached to the main bodies of the respective pellicle handling jigs 2, 3.

Next, the jig pins 4 of the earlier-step handling jig 2 were removed from the jig holes of the longer bars, and the handling jig 2 was taken away, and then the jig holes of the longer bars were refilled with jig pins (not shown) of the later-step handling jig 3 and thus the pellicle frame 1 was transferred to the later-step pellicle frame handling jig 3, which then went through the later steps.

Thus, in accordance with the conventional procedure of pellicle manufacturing, a mask agglutinant was applied to that annular face of the pellicle frame 1 that was opposite to the membrane receiving annular face; then the pellicle frame 1 was let to sit for 60 minutes, and next it was heated by a high frequency induction heater to 150 degrees centigrade and thus dried. A membrane adhesive was applied to the membrane receiving annular face of the frame 1 and a pellicle membrane was pasted on it and a pellicle is completed.

As the completed pellicle was inspected, the frame had not been contaminated with particles. Nor did the inspection reveal any contamination of the pellicle membrane with particles.

Then, twenty of the completed pellicles were each contained in a pellicle container and were dropped from a height of 10 cm and the pellicle membrane was inspected again to see if there was any increase in the number of particles.

None of the twenty pellicles dropped showed increase in the number of the particles on the pellicle membrane.

Example 2

A pellicle frame similar to the one of Example 1 was prepared. Then, the pellicle frame was set to an earlier-step handling jig in the same manner as in Example 1, and the inner wall of the frame was coated with an adhesive, and in order to remove the earlier-step handling jig a later-step handling jig was used to further grasp the frame by the jig holes of the shorter frame bars.

After confirming that the frame was grasped by the two handling jigs at the same time, the jig pins of the earlier-step handling jig were removed from the jig holes, and the earlier-step handling jig was taken away, and thus the pellicle frame was transferred to the later-step handling jig. Thereafter, a pellicle was completed through the same procedure as in Example 1.

When the frame of the completed pellicle was inspected in the same manner as in Example 1, no particle was found sticking to is. No particle was observed on the pellicle membrane either.

Like in Example 1, twenty completed pellicles were encased in a pellicle container and were dropped from the height of 10 cm, and the pellicle membrane was inspected again to see if there was any increase in the number of particles.

None of the twenty pellicles dropped showed increase in the number of the particles on the pellicle membrane.

Example 3

A pellicle frame similar to the one of Example 1 was prepared. Each of the longer frame bars was bored to have four jig holes in its outer side face, two at positions 52 mm away from the middle of the respective longer frame bar and 104 mm away from each other, and the two others at positions 62 mm away from the middle of the respective longer frame bar and 124 mm away from each other, and all were distanced from the pellicle membrane receiving annular face of the frame by 1.75 mm, and had a diameter of 1.6 mm and a depth of 1.2 mm. Then, a pellicle is completed in a similar procedure as in the case of Example 1 except that the pellicle frame was gasped at its 104 mm-distanced jig holes by an earlier step handling jig at first and then it was transferred to a later step handling jig, which grasped the frame at its 124 mm-distanced jig holes with the help of a jig replacement apparatus.

When the frame of the completed pellicle was inspected in the same manner as in Example 1, no particle was found sticking to it. No particle was observed on the pellicle membrane either.

Like in Example 1, twenty completed pellicles were encased in a pellicle container and were dropped from the height of 10 cm, and the pellicle membrane was inspected again to see if there was any increase in the number of particles.

None of the twenty pellicles dropped showed increase in the number of the particles on the pellicle membrane.

In Example 3, however, all the jig holes were made in the longer bars of the pellicle frame, so that during the transfer of the pellicle frame, there was an occasion on which all the pins were inserted in the longer bars and hence the jig replacement apparatus had to be designed to have more complicated structure than in the case of the Example 1, so as to avoid collision between the jig pins, etc.

Comparative Example 1

A pellicle frame similar to the one of Example 1 was prepared. Each of the longer frame bars was bored to have two jig holes in its outer side face, at positions 52 mm away from the middle of the respective longer frame bar and 104 mm away from each other, and all were distanced from the pellicle membrane receiving annular face of the frame by 1.75 mm, and had a diameter of 1.6 mm and a depth of 1.2 mm.

Then, the frame was grasped by an earlier step handling jig, and the earlier step handling jig was set to a jig replacement apparatus. A supporter (not shown) that was designed to receive a pellicle frame at the bottom face was brought to support the pellicle frame in a manner such that the supporter was in contact with the frame at areas immediately beneath the jig holes and extending, in the direction of the jig holes, across the frame bars with a width of 1 mm; then, the jig pins were removed from the jig holes. When the earlier-step handling jig was taken away, a later-step handling jig was set to the jig replacement apparatus and jig pins of the later-step handling jig were inserted into the jig holes of the pellicle frame whereby the pellicle frame was transferred to the later-step jig handling jig. Then, a pellicle is completed in a similar procedure as in the case of Example 1.

When the completed pellicle was inspected in a similar manner as in Example 1, of the twenty pellicles seven were found to have particles sticking to the area where the supporter touched the frame. The pellicle membrane was also inspected, and no particle was found on it in all twenty pellicles.

Like in Example 1, twenty completed pellicles were each encased in a pellicle container and were dropped from the height of 10 cm, and the pellicle membrane was inspected again to see if there was any increase in the number of particles.

In two of the twenty pellicles dropped there was found one particle lying on the pellicle membrane.

[Rating]

From the results of Examples 1-3 and Comparative Example 1, it has been confirmed that with the pellicle frame of the present invention, which is capable of being grasped or supported only at its jig holes throughout the pellicle manufacturing process, it is possible to avoid contamination with particles, and that, on the other hand, with a pellicle frame which was contacted by a matter at positions in addition to the jig holes, there is a tendency that the contamination by particle sticking occurs at areas where the contact was made in a certain likelihood.

Also, it was found that the particles sticking to the frame can move to the pellicle membrane when a container in which the pellicle is encased receives a strong concussion. It was also confirmed that the pellicle frame of the present invention is remarkably effective in preventing creation of particles during the exchanging of the pellicle handling jigs.

EXPLANATION OF THE REFERENCE NUMERALS

1: pellicle frame
2: earlier-step handling jig
3: later-step handling jig
4: jig pin of the earlier-step handling jig
5: jig pin of the later-step handling jig
6: block of the earlier-step handling jig
7: block of the later-step handling jig

What is claimed is:

1. A combination comprising:
a rectangular one-piece pellicle frame comprising: four side bars having at least eight bored jig holes in outer side walls of the four side bars for handling the pellicle, wherein at least four jig holes are formed in each one of a certain pair of facing side bars or at least two jig holes are formed in every one of the four side bars;
a first handling jig arranged around the rectangular one-piece pellicle frame and including four side bars and four jig pins, two of the four side bars facing each other and having two first jig pins respectively, the two first jig pins extending inwardly from each of the two of the four side bars to two of the at least eight bored jig holes to support the one-piece pellicle frame;
a second handling jig arranged around the first handling jig and including four side bars and four jig pins, two of the four side bars facing each other and having two second jig pins respectively, the two second jig pins extending inwardly from each of the two of four side bars to two of the at least eight bored jig holes to support the one-piece pellicle frame; and wherein the pellicle frame is grasped or supported only by the jig holes.

2. A combination as claimed in claim 1, wherein the at least four jig holes are formed in each one of said certain pair of opposite side bars.

3. A combination as claimed in claim 2, wherein the rectangular one-piece pellicle flame includes a pellicle.

4. A combination as claimed in claim 1, wherein the at least two jig holes are formed in every one of the four side bars.

5. A combination as claimed in claim 1, wherein the four side bars are integrally formed as one member.

6. A combination according claim 1, wherein the at least two jig holes are arranged in each of the four side bars, and an extending direction of the four jig pins of the first handling jig is orthogonal to that of the second handling jig.

* * * * *